(12) United States Patent
Mitchell et al.

(10) Patent No.: US 6,169,328 B1
(45) Date of Patent: Jan. 2, 2001

(54) SEMICONDUCTOR CHIP ASSEMBLY

(75) Inventors: Craig Mitchell, Santa Clara; Mike Warner, San Jose; Jim Behlen, Sunnyvale, all of CA (US)

(73) Assignee: Tessera, Inc, San Jose, CA (US)

( * ) Notice: Under 35 U.S.C. 154(b), the term of this patent shall be extended for 0 days.

(21) Appl. No.: 09/246,056

(22) Filed: Feb. 8, 1999

Related U.S. Application Data (60) Continuation-in-part of application No. 08/842,313, filed on Apr. 24, 1997, which is a division of application No. 08/365,699, filed on Dec. 29, 1994, now Pat. No. 5,659,952, which is a continuation-in-part of application No. 08/309,433, filed on Sep. 20, 1994, now abandoned.

(51) Int. Cl.[7] .......................... H01L 23/48; H01L 23/52; H01L 29/40

(52) U.S. Cl. .......................... 257/778; 257/786; 257/787; 257/789; 257/675; 257/719

(58) Field of Search .................................. 257/778, 786, 257/787, 789, 675, 719

(56) References Cited

U.S. PATENT DOCUMENTS

| | | | |
|---|---|---|---|
| 4,190,855 | 2/1980 | Inoue | 257/783 |
| 4,300,153 | 11/1981 | Hayakawa et al. | 257/783 |
| 4,381,602 | 5/1983 | McIver | 29/840 |
| 4,396,936 | 8/1983 | McIver et al. | 257/783 |
| 4,642,889 | 2/1987 | Grabbe | 29/840 |
| 4,955,132 | 9/1990 | Ozawa | 29/804 |
| 5,001,542 | 3/1991 | Tsukagoshi et al. | 257/783 |
| 5,110,388 | 5/1992 | Komiyama et al. | 156/229 |

(List continued on next page.)

FOREIGN PATENT DOCUMENTS

| | | |
|---|---|---|
| 1-155633 | 6/1989 | (JP) . |
| 1-164054 | 6/1989 | (JP) . |
| 1-235261 | 9/1989 | (JP) . |
| 1-253926 | 10/1989 | (JP) . |
| 1-278755 | 11/1989 | (JP) . |
| 2-056941 | 2/1990 | (JP) . |
| 4-91443 | 3/1992 | (JP) . |
| 4-137641 | 5/1992 | (JP) . |
| 94/03036 | 2/1994 | (WO) . |

OTHER PUBLICATIONS

Electronic Packaging and Interconnection Handbook, pp. 1–35, C. Harper, Nov. 1992.*

*Primary Examiner*—David Hardy
*Assistant Examiner*—Jhihan B Clark
(74) *Attorney, Agent, or Firm*—Lerner, David, Littenberg, Krumholz & Mentlik, LLP (57) ABSTRACT

A semiconductor chip package structure for providing a reliable interface between a semiconductor chip and a PWB to accommodate for the thermal coefficient of expansion mismatch therebetween. The interface between a chip and a PWB is comprised of a package substrate having a plurality of compliant pads defining channels therebetween. The package substrate is typically comprised of a flexible dielectric sheet that has leads and terminals on at least one surface thereof. The pads have a first coefficient of thermal expansion ("CTE") and are comprised of a material having a fairly low modulus of elasticity. An encapsulant having a second CTE lower than the CTE of the compliant pads is disposed within the channels to form a uniform encapsulation layer. The pads are in rough alignment with the conductive terminals on the package substrate thereby allowing independent movement of the terminals during thermal cycling of the chip. The encapsulant encases the conductive leads electrically connecting the terminals to chip contacts on a face surface of the chip. The lower CTE of the encapsulant controls the flexing of the conductive leads so that the leads do not prematurely fatigue and become unreliable while the lower modulus compliant pads relieve the stress on the solder balls induced by the CTE mismatch of the chip and the PWB.

44 Claims, 8 Drawing Sheets

U.S. PATENT DOCUMENTS

| | | | |
|---|---|---|---|
| 5,140,404 | 8/1992 | Fogal et al. | 257/783 |
| 5,148,265 | 9/1992 | Khandros . | |
| 5,148,266 | 9/1992 | Khandros et al. | 257/783 |
| 5,194,930 | 3/1993 | Papthomas et al. | 257/773 |
| 5,203,076 | 4/1993 | Banerji et al. | 29/840 |
| 5,225,966 | 7/1993 | Basavanhally et al. | 361/406 |
| 5,249,101 | 9/1993 | Frey et al. | 361/717 |
| 5,265,329 | 11/1993 | Jones et al. | 29/832 |
| 5,316,788 | 5/1994 | Dibble et al. | 427/98 |
| 5,355,283 | 10/1994 | Marrs et al. | 361/760 |
| 5,363,277 | 11/1994 | Tanaka | 361/760 |
| 5,371,404 | 12/1994 | Juskey et al. | 257/659 |
| 5,431,571 | 7/1995 | Hanrahan et al. | 439/91 |
| 5,477,611 | 12/1995 | Sweis et al. | 29/840 |
| 5,483,106 | 1/1996 | Echigo et al. | 257/783 |
| 5,563,445 | 10/1996 | Iijima et al. | 257/698 |
| 5,656,862 | 8/1997 | Papathomas et al. | 257/778 |

* cited by examiner

SEMICONDUCTOR CHIP ASSEMBLY

CROSS REFERENCE TO RELATED APPLICATIONS

This application is a continuation-in-part of U.S. patent application Ser. No. 08/842,313, filed Apr. 24, 1997 which is a divisional application of Ser. No. 08/365,699, filed Dec. 29, 1994, now U.S. Pat. No. 5,659,952 which in turn is a continuation-in-part of U.S. patent application Ser. No. 08/309,433 filed Sep. 20, 1994, now abandoned, all of the disclosures of which are hereby incorporated by reference herein.

FIELD OF THE INVENTION

The present invention relates, generally, to providing a compliant interface for a semiconductor chip, and more particularly relates to a method and apparatus for providing a compliant interface to accommodate for differences in the coefficient of thermal expansion mismatch between a semiconductor chip and a support structure, such as a printed wiring board.

BACKGROUND OF THE INVENTION

In attempting to use the area on printed wiring boards more efficiently, semiconductor chip manufactures have recently been switching from larger, more cumbersome interconnection conventions, such as pin grid arrays ("PGAs") and the perimeter leaded quad flat packs ("QFPs"), to smaller conventions, such as ball grid arrays ("BGAs"). Using BGA technology, semiconductor chips are typically interconnected to their supporting substrates using solder connections, such as with "flip-chip" technology. However, when solder alone is used to interconnected the chip contracts to the substrate, the columns of solder are generally designed to be short to maintain the solder's structural integrity. This results in minimal elastic solder connections properties which further results in increased susceptibility to solder cracking due to the mechanical stress of the differential coefficient of thermal expansion ("CTE") of the chip relative to the supporting substrate thereby reducing the reliability of the solder connection. In other words, when the chip heats up during use, both the chip and the substrate expand; and when the heat is removed, both the chip and the substrate contract. The problem that arises is that the chip and the substrate expand and contract at different rates and at different times, thereby stressing the interconnections between them. As the features of semiconductor chips continue to be reduced in size, the number of chips packed into a given area will be greater and the heat dissipated by the each of these chips will have a greater effect on the thermal mismatch problem. This further increases the need for a highly compliant interconnection scheme for the chips.

The solder cracking problem is exacerbated when more than one semiconductor chip is mounted in a package, such as in a multichip module. Multichip modules continue to grow in popularity; however, as more chips are packaged together, more heat will be dissipated by each package which, in turn, means the interconnections between a package and its supporting substrate will encounter greater mechanical stress due to thermal cycling. Further, as more chips are integrated into multichip modules, each package requires additional interconnections thereby increasing the overall rigidity of the connection between the module and its supporting substrate.

An interconnection solution put forth in U.S. Pat. No. 4,642,889, entitled "Compliant Interconnection and Method Therefor" issued to Grabbe seeks to alleviate the aforementioned solder cracking problem by embedding wires within each solder column to reinforce the solder thereby allowing higher solder pedestals and more elasticity. Another solution includes spirally wrapping wire around the outside of the solder. A further solution put forth includes providing a combination of solder and high lead solder, as found in U.S. Pat. No. 5,316,788, entitled "Applying Solder to High Density Substrates" issued to Dibble et al.

Still other prior art solutions make use of a underfill material disposed between the chip and the supporting substrate in an attempt to reduce the stress caused by CTE mismatch. Without the underfill material, this stress is typically concentrated at the weakest part of the solder balls. The underfill material allows this stress to be more uniformly spread out over the entire surface of the solder balls. Examples of the use of underfill materials may be found in U.S. Pat. Nos. 5,194,930, 5,203,076 and 5,249,101. All of these prior art solutions are aimed at reducing the shear stress endured by the interconnections caused by thermal cycling. However, each of these solutions also encounters significant problems such as insufficient compliancy and process cost.

Several inventions, commonly assigned to the assignee of the present invention, deal effectively, but specifically differently, with the thermal cycling problem. For example, U.S. Pat. No. 5,148,266 discloses improvements in semiconductor chip assemblies and methods of making the same. As set forth in the '266 patent, a semiconductor chip can be connected to a substrate using a sheet-like, and preferably flexible, interposer. The interposer overlies the top, contact-bearing surface of the chip. A first surface of the interposer faces towards the chip whereas a second surface faces away from the chip. Electrical terminals are provided on the second surface of the interposer, and the interposer is provided with apertures extending through it. Flexible leads extend through these apertures between contacts on the chip and the terminals on the second surface of the interposer. The terminals can be bonded to a substrate. Because the terminals are movable relative to the contacts on the chip, the arrangements described in the '266 patent provide excellent resistance to differential expansion of the chip relative to the substrate caused by thermal cycling. The interposer disclosed in the '266 patent may also include a compliant layer disposed between the terminals and the chip.

Copending, commonly assigned U.S. patent application Ser. No. 08/123,882, filed Sep. 20, 1993, the disclosure of which is hereby incorporated herein by reference, discloses a method for creating an interface between a chip and chip carrier including spacing the chip a given distance above the chip carrier, and introducing a liquid in the gap between the chip and carrier. Preferably, the liquid is an elastomer which is cured into a resilient layer after its introduction into the gap. In another preferred embodiment, the terminals on a chip carrier are planarized or otherwise vertically positioned by deforming the terminals into set vertical locations with a plate, and a liquid is then cured between the chip carrier and chip.

Despite the positive results of the aforementioned commonly owned inventions, still further improvements would be desirable.

SUMMARY OF THE INVENTION

The present invention provides a semiconductor chip package employing differing CTE characteristics and modulus of elasticity (or simply "modulus") for certain of the elements within the package itself to facilitate a highly reliable package structure thereby providing a chip package solution that accommodates for the typically large thermal expansion mismatch between a chip and an underlying printed wiring board ("PWB").

More specifically, one aspect of the present invention provides a semiconductor chip package with a sheet-like package substrate having a first and second major surface. The substrate further includes terminals situated such that they are exposed at the second substrate surface. One or more compliant pads are disposed in abutment with the first surface of the sheet. Preferably, a plurality of compliant pads having a relatively low modulus of elasticity are disposed or otherwise attached to the substrate and define at least one channel therebetween. The one or more pads are provided on the substrate so that the substrate terminals are roughly aligned above the pads. The material comprising the compliant pads has a first CTE of between 50 to 400 ppm/° C. and a modulus of below 300 MPa. A chip unit which includes a semiconductor chip having a plurality of chip contacts on a face surface, and which may also include other components such as a heat spreader, is positioned over and may be attached to the compliant pads such that the contacts of the chip are not covered by the compliant pads. The substrate leads are then electrically connected to respective chip contacts by leads, so that the contacts and the terminals are electrically and mechanically connected together. Typically, the leads are a flexible, electrically conductive structures provided on the substrate. An encapsulant is then injected or deposited around the at least one pad and, where more than one pad is provided, into and through the channels between the pads. The encapsulant wets the package elements as it encapsulates the package structure. The encapsulant is cured after the package assembly is fully encapsulated, so that the cured encapsulant and pads cooperatively form a composite layer between the chip unit and the substrate. The cured encapsulant has a second CTE lower than the first CTE of the compliant pads. This second CTE is between 15 to 300 ppm/° C. and a modulus of between 100 MPa. to 8 GPa. The package terminals are then connected to a PWB typically by using heat activated joining units, such as solder balls or solid core solder balls. This package structure allows the terminals to move during thermal cycling of the chip while controlling the flexing of the leads using the higher modulus encapsulant to provide mechanical strength.

The aforementioned package elements can be used with a fan-in package structure in which all of the package terminals are located within a periphery of the chip, or a fan-out package structure in which all of the package terminals are located beyond a periphery of the chip, or a fan-in/fan-out package structure in which some of the package terminals are located within the periphery of the chip and some of the terminals are located beyond the periphery of the chip.

In a fan-out or fan-in/fan-out package embodiment, the chip unit may include a heat spreader attached to the back of the chip, and outer encapsulant portions are provided which extend beyond the periphery of the chip. One example of such a heat spreader includes a substantially planar, thermally conductive sheet that is attached to a back surface of the chip using standard die attach material and is further attached to the outer encapsulant portions. Another example of an acceptable heat spreader includes a thermally conductive element having an indentation in one surface and a flange area encircling the indentation. The chip is then placed in the indentation in the heat spreader such that the face surface of the chip is roughly co-planar with the flange portions of the heat spreader. While it is possible to have a heat spreader indentation structure that would not place the chip's face surface in rough co-planar relationship with the flange portions of the heat spreader, having the chip's face surface in rough co-planar arrangement with the flange portions of the heat spreader allows the pads beneath the chip and beneath the flange portion of the heat spreader to be approximately the same thickness.

The foregoing and other objects and advantages of the present invention will be better understood from the following Detailed Description of a Preferred Embodiment, taken together with the attached Figures.

DETAILED DESCRIPTION OF A PREFERRED EMBODIMENT

Figure 1:
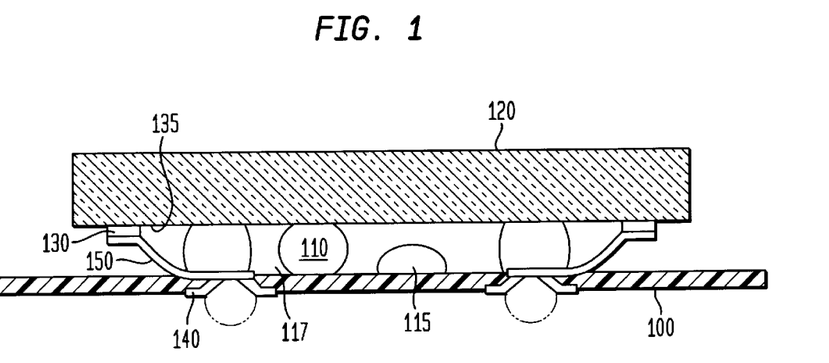
FIG. 1 shows a side view of one embodiment of a compliant semiconductor chip interface having a plurality of compliant pads, according to the present invention.
Figure 2:
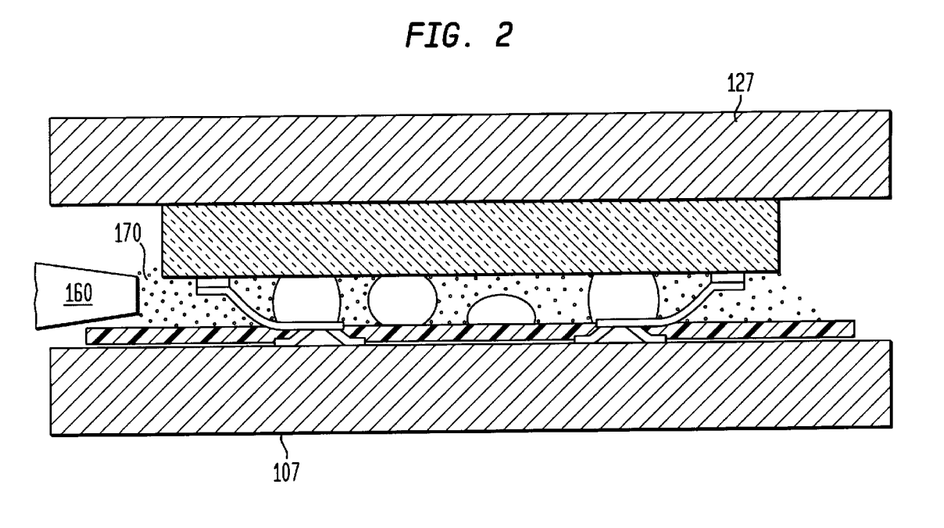
FIG. 2 shows a side view of the embodiment shown in FIG. 1, wherein the channels between the compliant pads are filled with a curable liquid, according to the present invention.

FIGS. 1 and 2 show a side view of a chip size package embodiment, according to the present invention. A support structure 100 is provided having a first and a second surface. The support structure 100 may be substantially rigid, semi-rigid or flexible. However typically, the support structure 100 is comprised of a flexible, but substantially inextensible, dielectric film, preferably formed from a polymeric material, such as Kapton™ "E" available from DuPont Chemical Corp., of an approximate thickness between 25 microns and 75 microns. Further, the dielectric film 100 typically has conductive terminals 140 on its second surface.

A plurality of dielectric compliant pads 110 are attached to the first surface of the film 100. The compliant pads 110 are typically made of an curable liquid elastomer material, such as the Dow Corning silicone elastomer 577, known as "Sylgard™", with about 5–10% of fumed silica in order to obtain a stiff, thixotropic consistency. The height of the compliant pads 110 is nominally uniform, as defined by the measurement from the base of the pads, at the first surface of the film, to the apexes of the pads. However, exact uniformity in height is not critical, as discussed below. The ratio of width to height of each pad 110 is desirably about two to one (2:1) or greater in order to maintain good pad structural integrity. Each pad desirably has width or diameter, measured at its juncture with first surface of the film 100, between about 300 μm to 2000 μm. The pads are arranged in a grid pattern with center-to-center distance or "pitch" greater than the minimum width of each pad and preferably greater than the maximum width of each pad. Thus, each pair of mutually adjacent pads defines a channel 117 between them, and all of the channels are interconnected with one another to define a substantially continuous grid of channels 117. The pad pitch and hence the width of the channels 117 must be large enough to allow a compliant filler material 170 to be injected into the channels 117, as described in greater detail below.

Figure 3A:
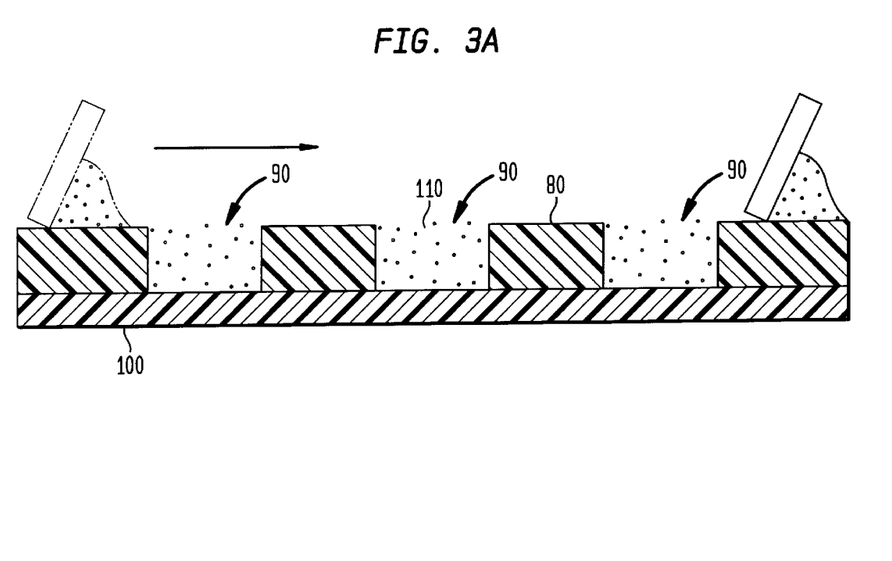
FIGS. 3A and 3B show a side view of the mask and elastomer used to form the compliant pads, according to further embodiments of the invention.
Figure 3B:
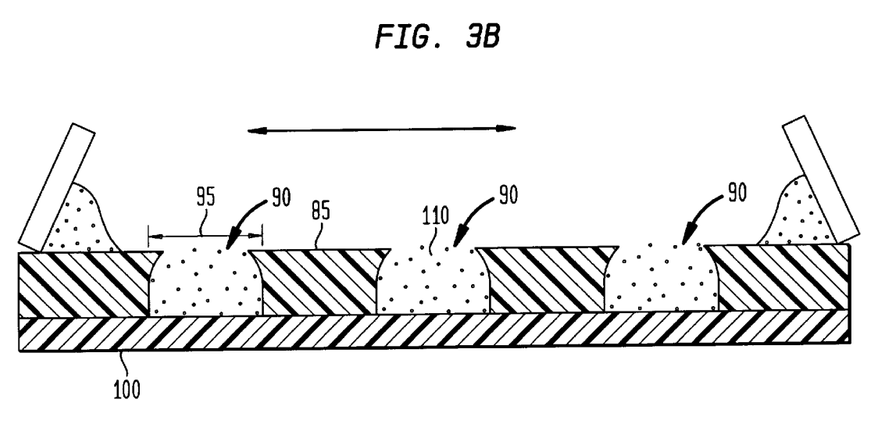

As shown in FIGS. 3A and 3B, the compliant pads 110 are typically formed and attached to the dielectric film 100 using a stencil mask 80 having top and bottom surfaces and further having a plurality of holes 90 extending therethrough. In a preferred embodiment, the bottom surface of the mask 80 is placed atop the first surface of the film 100 and curable liquid elastomer is wiped or screened across the first surface of the mask 80 so that the elastomer is deposited into each of the holes 90. If the elastomer is viscous or thixotropic enough, the mask is then typically removed and the pads are cured or partially cured by heating or exposing them to ultra-violet light or a combination thereof, such as by exposing the elastomer to ultraviolet light to create a "skin" of cured elastomer and then curing or partially curing the elastomer by a heating step. In the case of Dow 577 elastomer, the elastomer is typically heated to approximately 125° C. for 40 minutes.

The mask 80 may also be removed after the curing step. In this case, the elastomer will conform to the shape of the hole 90 in the mask as it begins to cure. Thus, the pads 110 in FIG. 3A will be cylindrical in shape with substantially flat top surfaces. If the mask 80 is left atop the dielectric film 100 during the curing step, the pads may partially adhere to the mask 80 at an exposed top edge of each hole 90 on the first surface of the mask as the elastomer cures. This makes removal of the mask 80 while maintaining the integrity of the pads 110 difficult. This problem can be effectively dealt with by using an alternate stencil mask 85, shown in FIG. 3B, where each hole in the mask has a smaller top edge circumference on the top surface of the mask 85 than on the bottom surface of the mask 85. The smaller circumference of each hole reduces the strength of the attachment of the compliant pads 110 to the mask 85. However, because of the shape of enclosure 95 of the embodiment shown in FIG. 3B, the liquid elastomer typically must be screened across the first surface of the mask in two directions to ensure the enclosure 95 is completely filled. The elastomer will then take on a rounded shape corresponding the shape of the enclosure 95 and will retain its shape after curing. The Dow 577 elastomer, discussed above, also shrinks by approximately 5% during the curing step thereby facilitating the removal of the mask 85. Another solution to this problem would be to coat the mask 80 with a material that will resist the adherence of the elastomer as it cures.

Returning to FIG. 1, a semiconductor chip 120 is next abutted to the compliant pads 110. The chip 120 has a face surface 135 bearing contacts 130 and a back surface. The face surface of the chip is aligned with the compliant pads so that the none of the pads 110 cover the contacts on the chip. In the next step of the operation, the dielectric film 100 and the second support structure or chip 120 are squeezed together between a first platen 107 and a second platen 127. The platens are urged toward one another by a press (not shown). The first platen bears on the terminals 140 of the film 100, and forces these terminals into substantially coplanar alignment, whereas the second platen bears on the back surface of chip 120. During this process, the pads 110 are compressed. The extent of such compression varies from pad to pad, depending upon the original height of each pad, the heights of the various terminals 140 and other tolerances. Because the pads can accommodate variations in this manner, the heights of the pads prior to compression need not be precisely uniform. Some particularly short pads, such as pad 115, may not contact the chip surface even after compression. This situation is acceptable provided that the remaining pads substantially support the terminals 140 against the first platen.

Where the pads 110 are only partially cured during the pad forming process, described above, they are tacky and adhere to the chip 120 when it is compressed thereagainst. In a preferred embodiment, the chip 120 would be heated to about 100° to 180° C. and then compressed against the pads 110 so that the partially cured pads 110 fully cure due to the heat of the chip 120 and in so doing adhere to the face surface of the chip. Alternately, the apex of each pad may be made tacky by providing an adhesive, a silicone gel, or a film of uncured silicone elastomer thereon so that the chip 120 adheres thereto. Similarly, the chip surface may be coated with an adhesive in the regions remote from the contacts 130 so that the tips of the pads 110 engage such adhesive. While adherence of the pads 110 to the chip 120 helps maintain the alignment between the chip 120 and the film 100, it is not imperative that the pads 110 are adhered to the chip 120 so long as the chip can be held in place by compressing it against the pads 110. The heat and pressure applied during this step of the process permanently deform or "set" the pads to the heights and shapes achieved when the film and chip are squeezed between the platens. Once set in this manner, the pads tend to retain the film and chip in the same relative positions as achieved during the squeezing step, and thereby tend to retain the terminals 140 in coplanar alignment with one another.

The contacts 130 on the chip 120 are then attached to the terminals 140 on the film 100 through any suitable means. In this embodiment, each contact 130 is electrically connected to one terminal 140 through a flexible lead 150 extending therebetween. The terminal 140 is comprised of a conductive blind via (a via extending from the second to the first surface of the film 100 and having a dosed bottom surface substantially in a plane with the first surface of the dielectric film 100) and a solder ball (shown in dashed lines), which is typically attached after the package is complete.

As shown in FIG. 2, a low viscosity compliant filler 170 is then disposed between the chip 120 and the dielectric film 100 through the channels between the adjacent pads 110. An injection nozzle 160 is disposed adjacent an edge of the film 100. The filler 170 passes through the nozzle into the channels 117. The compliant filler 170 may be comprised of an elastomer, a gel or a compliant thixotropic material so long as the elastomer, gel or material retains its compliancy. One example of such a filler is Dow Coming elastomer Q1-4939. In a preferred embodiment, the filler 170 is comprised of a curable liquid elastomer having a viscosity adapted to facilitate flow of the liquid into the channels 117 between the adjacent pads 110. An evacuated environment can also be provided during the elastomer flow so that voids in the liquid elastomer caused by trapped air may be eliminated. Capillary action tends to pull the low viscosity liquid elastomer 170 into the channels 117 as the elastomer wets the pads, the chip and the film. The liquid elastomer 170 tends to remain between the chip and the substrate because of the surface tension forces. If necessary, however, the edges of the assembly may be closed by any suitable means to trap the liquid 170. During this process, the liquid elastomer also encapsulates leads 150. The liquid 170 is then cured, typically by heating the assembly while it is held between flat opposing surfaces, such as the platens 107, 127 used for the compression step. This results in a planar, compliant interface between the chip 120 and the dielectric film 100. The resulting assembly may then be freed to form an individual semiconductor chip package.

Figure 4A:
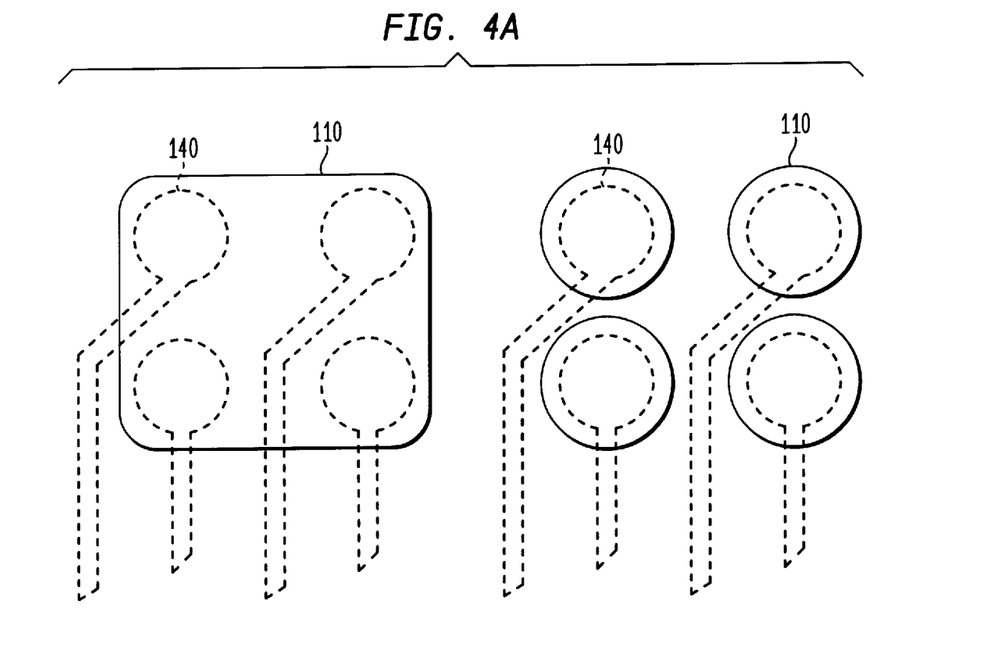
FIGS. 4A–C show a top plan view of several different pad shapes and registrations in relation to the terminal's positions, according to further embodiments of the invention.
Figure 4B:
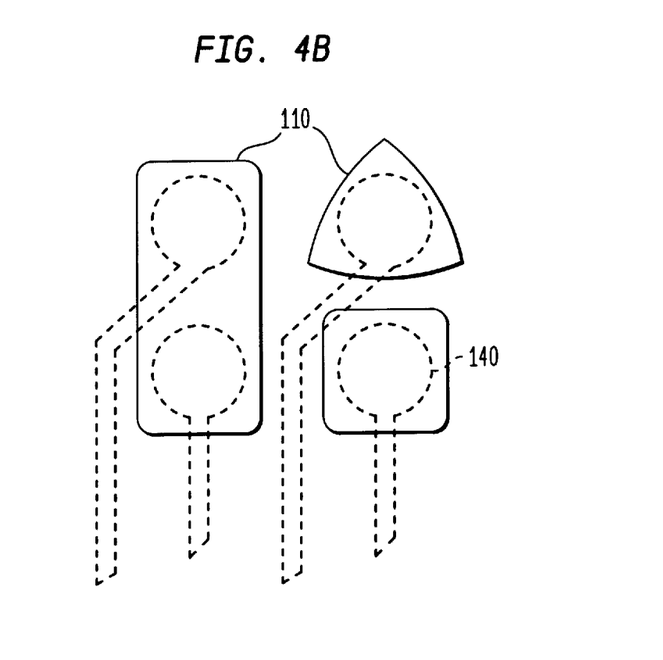
Figure 4C:
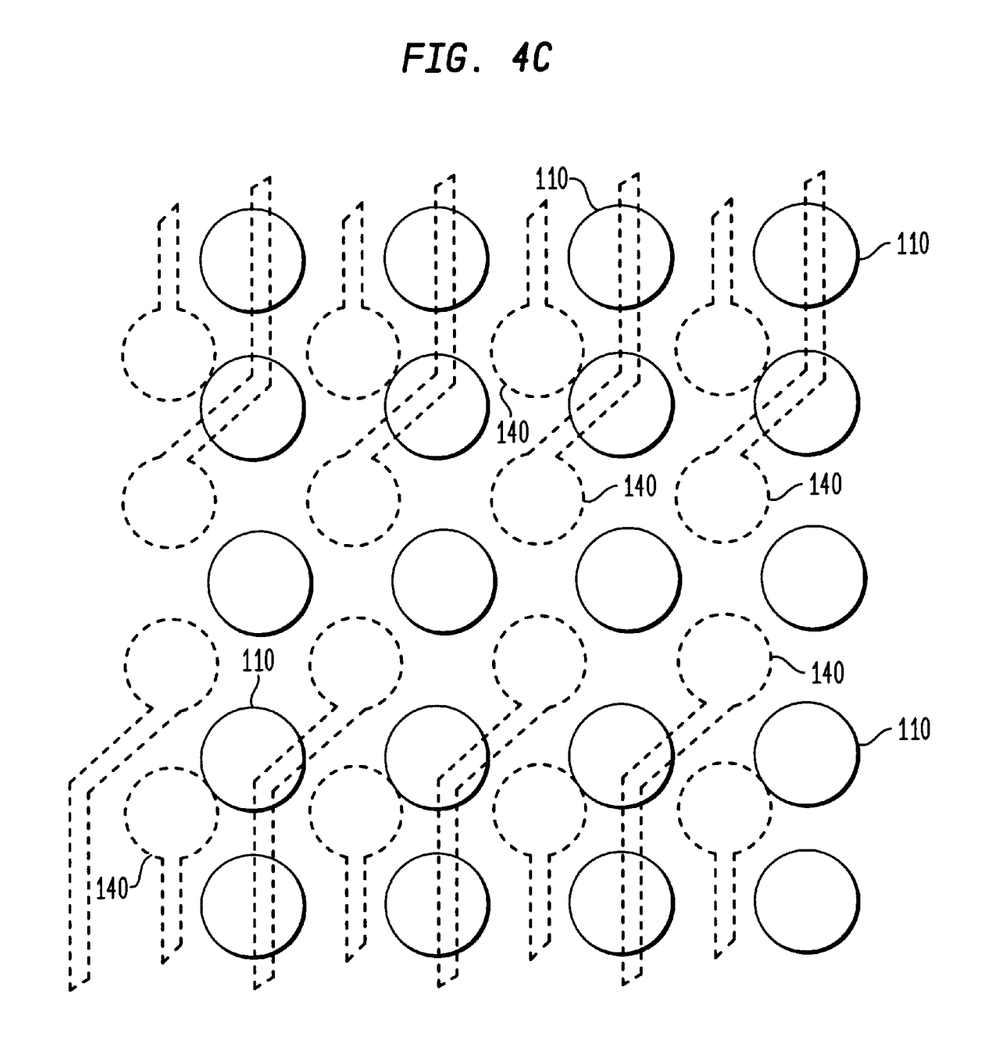

It is important to understand that the function of the compliant pads is to provide a uniformly supported, planar standoff between the chip and the dielectric film, while allowing the compliant filler to be injected between the adjacent pads 110 to create a compliant encapsulation layer having a controlled thickness. So long as there is uniformity of support, it does not matter whether the pads 110 are in direct registration with single or multiple terminals 140, as shown in FIGS. 4A and 4B, or whether the pads 110 are in random registration with respect to the terminals 140, as shown in FIG. 4C. It also does not matter whether all of the pads in a common array are of the same general shape or dimension.

Figure 5A:
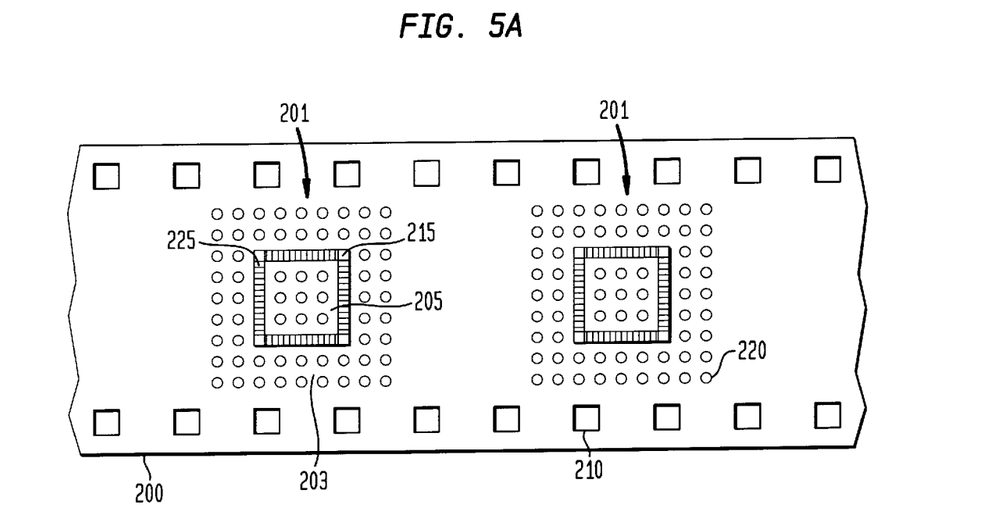
FIGS. 5A and 5B show a perspective and a side view of the support structure and compliant pads, according to a further embodiment of the present invention.

FIG. 5A shows a top plan of a preferred embodiment of the first support structure and the compliant pads. Tape 200 is a continuous elongated strip of film with handling and locating features such as sprocket holes 210 adapted for engagement by tape-handling equipment of the type commonly employed in tape automated bonding or "TAB" processing in the semiconductor industry. Tape 200 includes a plurality of regions 201 spaced apart along its length, each such region constituting a support structure for one chip. Each region has pads 220 disposed in a grid on its first surface so that the pads define channels 203 therebetween, and has terminals 207 on its second surface, the terminals being connected to leads 225 extending across an aperture or "bond window" 215 in the tape, the bond window being in the form of a slot extending around a rectangular loop. The leads are adapted for bonding to the contacts of the chip. For example, each lead may have a detachable section as disclosed in International Patent Publication WO 94/03036, the disclosure of which is hereby incorporated by reference herein. The terminals and leads can be arranged in a "fan out" pattern, wherein the terminals are disposed on that portion of the tape outside of the loop defined by the bond window; in a "fan in" pattern wherein the terminals are disposed on that portion of the tape encircled by the bond window; or both. Such a tape can be mass-produced, to include numerous regions.

In use, a series of chips can be bonded to the various regions of the tape by abutting each chip against the compliant pads of one region and compressing and bonding the chip and pads in the same manner as discussed above. Each pad 220 may be only partially cured, or else may have a tacky layer 230 (FIG. 5B) of adhesive, silicone gel or uncured silicone elastomer on its apex, so that the pads will adhere to the chip. Alternatively or additionally, the chip may have such a tacky layer on its first surface in areas remote from the contacts. During the abutting step, the tape is juxtaposed with each chip so that one region of the tape overlies the chip, and the contacts of each chip are brought into coarse alignment with the leads of the associated region of the tape, using conventional machine-vision alignment techniques. This alignment is maintained during the compressing and pad bonding steps. After the pads have been bonded to the surfaces of the chip, the bonded pads maintain the alignment of the leads and contacts. The terminals of each region are electrically connected to the contacts of the associated chip, as by advancing a bonding tool into the bond window to engage each lead and connect it to the aligned contact of the chip.

Figure 5B:
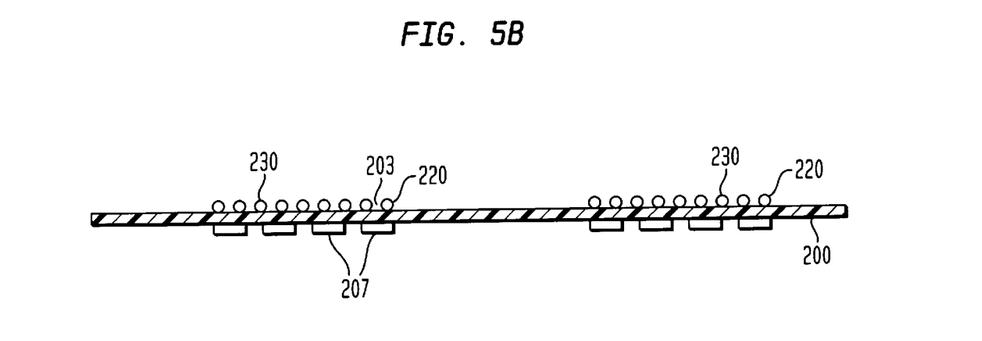

Preferably, the bonding tool captures the bond region of the lead and brings it into more precise alignment with the chip contact. After bonding the leads, the compliant filler 250 is introduced into the channels 203 between the pads, in substantially the same way as described above. Typically, the film 200 and the chip are compressed while the liquid material is introduced. These operations may be performed at separate stations of a processing line. At any time after the pads of a region have been bonded to a chip, the chip can be transported to the next station of the processing line by moving the tape using the sprocket holes 210. Each region of the tape can be severed from the remainder of the tape after all of the process steps have been completed to provide an individual chip and film assembly. Alternatively, each region can be severed before the final process step, and a portion of the process can be completed after severance. In a further embodiment of the invention, a plurality of individual regions of the tape may remain connected to one another.

Typically, each of these leads 225 will be detached within or near an edge of the bond window 215 when such lead is connected to a respective chip contact pad. If the leads and the terminals are arranged in a fan-out pattern, this action detaches the tape center portion 205, generally centered within the loop defined as the bond window 215 from the outer portions of the tape. However, the compliant pads 220 disposed on the tape center portion 205 provides support for the leads 225 during the bonding phase. Conversely, in a fan-in arrangement, the exterior portion of each region may optionally be removed after connecting the leads.

Figure 5C:
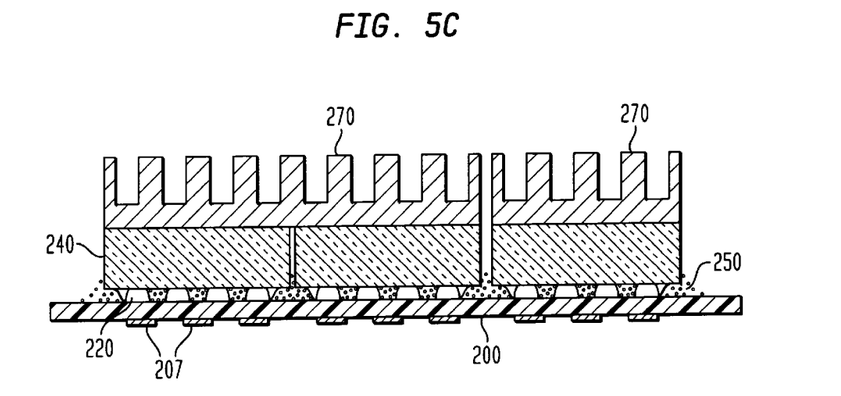
FIG. 5C shows a side view of the embodiment shown in FIGS. 5A and 5B, wherein multiple encapsulated chips have been abutted against the compliant pads.

In the alternative embodiment shown in FIG. 5C, a plurality of individual regions 201 of the tape remain together and are not severed from one another during the process. A short length of tape thus retains a plurality of chips side-by-side, as a multi-chip module. Thus, as illustrated in FIG. 5C, the back surfaces of these chips or modules may be mated to heat spreader/sinks 270 before or after the step of cutting the short length of tape bearing the chips free from the remainder of the tape. Further, a thermally conductive die attach material may be used between the chips 240 and the heat spreader 270 to aid in the transfer of heat from the chips. Such die attach materials are widely used in the semiconductor industry.

In a further alternative arrangement, a plurality of individual regions, each adapted to form a support structure for an individual chip, are formed side-by-side in a two-dimensional array on a unitary film in the shape of a panel. Plural chips are attached to these regions in the same manner as discussed above, so as to form a multichip assembly. In either arrangement where plural chips are employed, the steps of abutting and compressing the pads and injecting the liquid compliant filler can be performed simultaneously for all of the chips, using platens large enough to accommodate the entire array, or seriatim so that each chip is processed separately.

Figure 6:
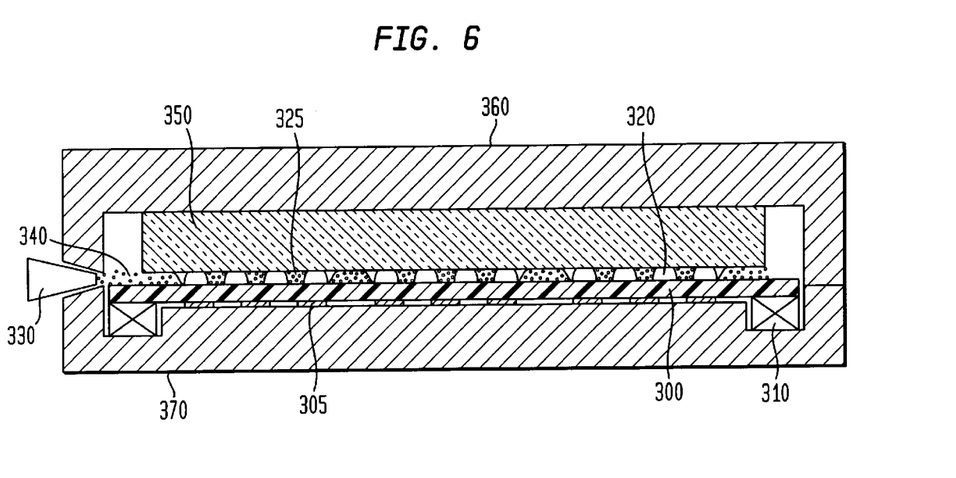
FIG. 6 shows a side view of a compliant interface being formed between a wafer and the support structure, according to a further embodiment of the present invention.

FIG. 6 shows a side view of a compliant interface, as described in reference to FIGS. 1 and 2, being formed between a second support structure or semiconductor wafer 350 having contacts (not shown) on a first surface and a first support structure or film 300. The wafer 350 includes an integral plurality of individual chips, each defining a portion of the first surface, and each including a plurality of contacts thereon. The film 300 has terminals 305 on its second surface, with leads (not shown) connected to the terminals 305. The terminals 305 and leads are disposed in a plurality of regions, each corresponding to one chip. Each region of the film may include a bond window (not shown), as discussed above.

Before engagement with the wafer 350, compliant pads 320 defining channels 325 therebetween are formed on the first surface of the film. Here again, each pad 320 may be only partially cured, or may have a curable tacky material on its apex. The film 300 is stretched taut and bonded to a rigid ring structure 310. The film 300 is then aligned with the wafer so that each region of the film is aligned with one chip of the wafer, and so that the leads are aligned with the contacts. The wafer is then abutted against the compliant pads 320. A platen 360 is applied on the back surface of the wafer 350. Another platen 370 is applied on the second surface of the film so as to engage the terminals 305. In the same manner as described above, the platens are forced toward one another, thereby compressing pads 320 and bringing the terminals 305 into substantially coplanar alignment with one another. While the terminals and pads are held in this position, the pads may be fully cured or set by heating the platen 360/wafer 350, thereby securing the film in position on the wafer. Alternatively, a tacky adhesive may be applied to the first surface of the wafer around the contacts thereon to ensure the adherence of the pads 320 to the wafer 350. After this operation, the leads are bonded to the wafer contacts, followed by injection of the liquid curable elastomer 340 with nozzle 330 into the channels 325. While the contacts are again held in position by the platens, the liquid elastomer is cured to form a complete assembly encompassing the entire wafer and all regions of the film.

Individual, fully encapsulated parts may then be cut from the wafer. These separated parts will have a compliant interface to accommodate for the thermal coefficient of expansion mismatch between the parts and their eventual supporting substrates, such as printed wiring boards. Further, the encapsulant protects the individual parts from moisture and contaminants.

Figure 7:
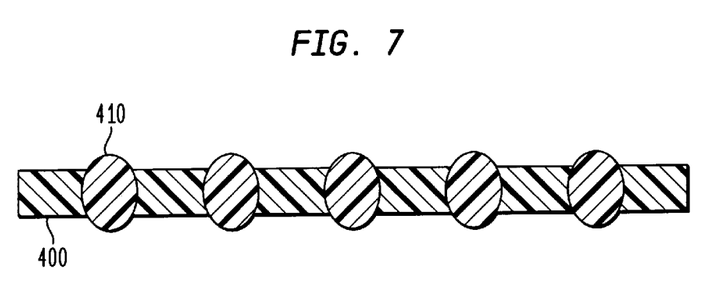
FIG. 7 shows a side view of a plurality of compliant pads disposed within holes in a holding element, according to a further embodiment of the present invention.

FIG. 7 shows a further embodiment having an array of compliant pads 410 held in place using a holding element 400. The pads 410 are then fixably placed atop either the contact bearing surface of a semiconductor chip (second support structure) or a flexible dielectric film (first support structure) typically by placing a tacky adhesive onto one of those surfaces. The holding element 400 is then removed. Desirably, the holding element 400 is made of a material which will break apart or peel off the pads easily so that the adherence of the pads 410 to either the wafer or the film is not compromised. The pads 110, as shown in FIG. 1, are not typically screened across and cured to the contact bearing surface of the chip for fear that the contacts will be contaminated by stray uncured elastomer. In the embodiment shown in FIG. 7, however, the pads are being attached after they have been either fully cured or partially cured to the point that they may retain their individual structural integrity. Thus, the pads 410 may be accurately placed and typically adhered on the chip's surface without any substantial fear that the chip's contacts will be contaminated. The pads are then compressed between the chip and the supporting substrate using platens and liquid elastomer is next injected into the channels between the adjacent pads and cured, as described more fully in relation to the above embodiments.

Figure 8:
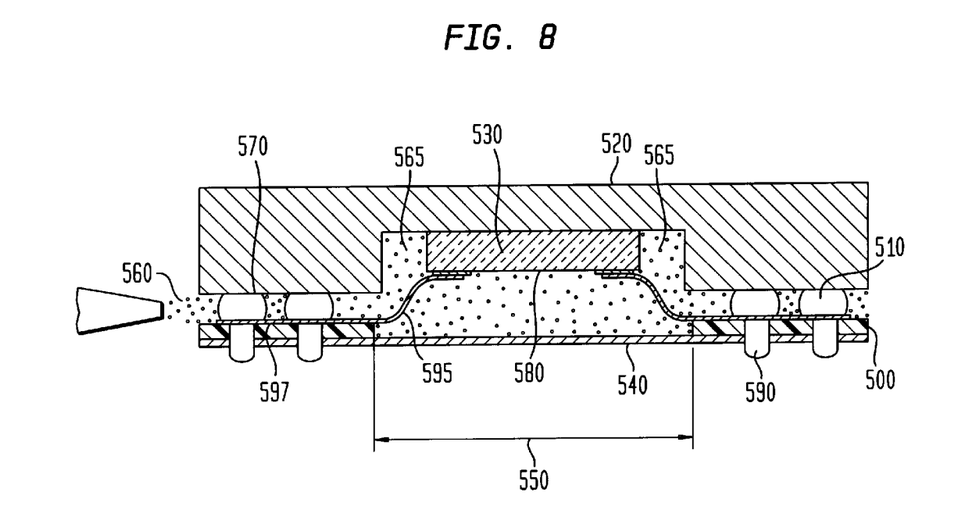
FIG. 8 shows a side view of a further embodiment of the present invention having a compliant interface between a heat spreader and a support structure.

The embodiment shown in FIG. 8 shows a side view of an alternate embodiment in which the pads 510 are compressed between a second support structure which includes a heat spreader 520 having an indentation on its first side and a flange portion 570 encircling the indentation and a first support structure 500 which includes a flexible dielectric film. A chip 530 is disposed within the indentation of the heat spreader 520 so that the face surface or contact-bearing surface 580 of the chip faces outwardly at the opening of the indentation, and thus faces outwardly from the first surface 570 of the heat spreader. Preferably, the face surface 580 of the chip 530 is in a rough co-planar arrangement with the flange portions 570 of the heat spreader 520. The chip and heat spreader cooperatively constitute a chip unit. Dielectric film 500 has a bond window 550, terminals 590 on one surface and leads 595 connected to the terminals 590. After pads 510 are provided on the dielectric film 500 or the heat spreader by any of the techniques discussed above, the dielectric film 500 and the chip unit are aligned so that the outer portions of the dielectric film overly the first surface 570, and so that the bond window 550 is aligned with the contacts on the chip. The leads 595 are bonded to the contacts of the chip. After bonding the leads, the bond window is closed by a sheet 540 of a further dielectric material such as a solder mask material which adheres to film 500 and thus forms a continuation of the film 500. Typically before bonding the leads, the pads 510 are compressed against first surface 570 by engaging the heat spreader 520 and the film 500 between a pair of platens (not shown) so that one such platen bears on the rear surface of the heat spreader, opposite from surface 570 and so that the other platen bears on terminals 590. This compression brings the terminals into coplanar alignment. As described above, the liquid compliant filler 560 is injected into the channels between the pads and cured while the platens hold the system in compression. In this embodiment, the pads are not provided at the interface between sheet 540 and the chip 530. If a solder mask 540, or other suitable containing means, is placed over the bonding window 550, a compliant filler material 560 may be injected between the adjacent pads 510 creating a planar, compliant interface while simultaneously encapsulating the chip 530.

In another variation of the above described packages, the compliant pads and the filler (or "encapsulant") have different coefficient of thermal expansion ("CTE") and modulus of elasticity ("modulus") characteristics. Stated another way, the pads and the filler form a composite layer including two materials of different characteristics, disposed between the chip unit and the substrate. In this situation, when the chip heats up and expands or cools down and contracts (known as "thermal cycling"), the compliant pads and the filler encapsulant expand and/or contract at different rates. Such differing CTE/modulus characteristics could have deleterious effects on the overall reliability of the chip package as one package element expands at a much greater rate than the other package elements. However, it has been found that if the package assembly is viewed as a total system, differing characteristics for the encapsulant filler and the compliant pad can facilitate total chip package reliability.

In fan-in package structures, as shown in FIG. 2, the CTE of the encapsulant 170 and the compliant pads 110 are typically the same or very similar. In one embodiment of such a fan-in package, the CTE of the silicon chip 120 is approximately 2.5 to 3.5 parts per million per degree Celsius (ppm/° C.), the CTE of the compliant pads 10 and the encapsulant 170 (if silicone is used) is approximately 250 to 300 ppm/° C. and the CTE of the substrate 100 and the terminal 140, traces (shown in FIG. 4) and the leads 150 are all approximately 15 to 20 ppm/° C. In this example, the modulus of the compliant pads and the encapsulant are approximately the same and relatively low to allow the terminals to move during thermal cycling, as described above. The package terminals 140 are then typically attached to a printed wiring board ("PWB") (not shown) that has a CTE similar to that of the substrate 100. In this package assembly system, the terminals 140, the substrate 100 and the PWB expand and contract at a similar rate while the compliant pads 110 and the encapsulant filler 170 expand and contract at a greater rate. This CTE mismatch in the package elements is not necessarily detrimental to package reliability because the modulus of the compliant pads 110 and encapsulant 170 is low enough (on the order of approximately 1 to 10 MPa.) to allow the package leads 150 to move and "flex" during thermal cycling of the package and to allow the terminals 140 to move independently in horizontal and/or vertical directions (relative to the chip face surface 135) to thereby mechanically decouple the chip 120 from the PWB. This arrangement works well in a fan-in package embodiment because there is a somewhat uniform thickness in the pad 110/encapsulant 170 layer between the chip 120 and the substrate 100 and because the expansion and contraction of this entire layer is largely determined by the CTE of the chip 120 itself. A package assembly system can encounter more reliability problems, however, when the pad/encapsulant layer's thickness is not as uniform and where this layer extends beyond the periphery of the chip, such as in FIGS. 8–10.

In the fan-out package shown in FIG. 8, the outer terminals 590 are disposed beyond or outside of the periphery of the chip 530. In this embodiment, the chip unit including chip 530 and heat spreader 520 is juxtaposed with a substrate 500. Substrate 500 is attached to the heat spreader 520 of the chip unit by a porous layer, such as the compliant pads 510, described above. The function of the compliant pads 510 is to provide a somewhat uniformly supported, planar standoff between the chip unit and the substrate 500 thereby allowing the leads 595 to be bonded or otherwise attached to respective chip contacts (not shown in detail). As described above, so long as there is uniformity of support for the chip substrate 500 in the vicinity of terminals 590 on the substrate, it does not matter whether all of the pads 510 are of exactly the same height from the substrate 500 to the chip surface. The compliant pads 510 further allow an encapsulant 560 to be injected between or dispensed and wicked between the adjacent pads 510 and between the chip 530 and spreader 520 and the substrate 500 to create an encapsulation layer having a controlled thickness, thus forming a composite layer including the pads and encapsulant. The chip unit defines a slot 565 extending away from the substrate, between the chip and the heat spreader. The area or slot 565 is filled with the encapsulant 560 and has a greater thickness than other areas of the composite layer. Moreover, the leads 595 which connect the chip contacts to the terminals on substrate 500 extend across slot 565 and hence extend across the thick area of encapsulant, the encapsulant being disposed around and beneath the leads. This thick area is bounded on essentially three sides by the chip 530, the heat spreader 520 and the compliant pads 510. During thermal cycling, the encapsulant 560 in this area or slot 565 will expand and contract in a direction generally towards the terminal 590 side of the package at a greater rate than it expands in a direction transverse to the terminals 590. This could cause the leads 595 to be flexed back and forth with greater force than when the leads were encapsulated in a uniform layer of encapsulant, as shown in FIG. 2 and discussed above; and therefore can lead to premature lead fatigue and/or fracture.

By looking at the total package system of FIG. 8, it is desirable to allow the terminals 590 to move during thermal cycling and to simultaneously control the flexing of the leads to better maintain lead integrity and reliability. This is accomplished by aligning the terminals 590 with the compliant pads 510 comprised of a fairly low modulus material (as shown in FIGS. 4A and 4B) while injecting or otherwise depositing an encapsulant 560 that is comprised of a material that has a lower CTE than that of the compliant pads 510. Since CTE and modulus typically have a somewhat inverse relationship, the encapsulant used in such an example would also typically have a higher modulus than the modulus of the compliant pads 510. This arrangement then allows the terminals to move somewhat independently and control the force placed upon the leads 595 during the expansion and contraction of encapsulant area 565.

If the composite layer including both a relatively stiff, high modulus encapsulant 560 and relatively soft pads 510 is considered as a whole, theoretical computation based on additive properties would predict that the layer would be relatively stiff, and would not allow significant movement of the terminals relative to the chip to take up dimensional changes due to thermal effects in service. However, since the terminals 590 are aligned with the complaint pads, they are allowed a certain degree of movement during thermal cycling. Although the present invention is not limited by any theory of operation, it is believed that the ability of the system to compensate for dimensional changes relates at least in part to local effects which occur when the pads 510 are in general alignment or registration with the terminals 590, and when the substrate is flexible. It is believed that under these conditions, flexing of the substrate can allow a terminal to move and tilt so as to accommodate relative motion due to thermal effects. The size or shape of the compliant pads is not critical and will be dictated by the desirable results achieved in particular chip package designs. For example, as shown in FIG. 4A, each pad 110 can be aligned with a respective terminal 140 or multiple terminals 140 can be aligned with just one pad 110. Also, a single package assembly may include areas where multiple terminals are aligned over a single pad 110 and areas where each terminals 140 is aligned over a respective pad 110. FIG. 4B shows other possible shapes and arrangements of pads. Typical modulus of elasticity values for the compliant pad 510 material include 1 to 300 MPa., and more preferably include compliant pad modulus values in the range of 50 to 200 MPa. Examples of suitable compliant pad 690 materials include silicones, epoxies, urethanes, gels, foams and combinations, blends and composites of such materials. One such particularly preferred compliant pad material is a silicone filled with fumed and/or fused silica in order to obtain the desired modulus.

It is important to consider the interaction at the pad/encapsulant interface especially where the package substrate is flexible. If the package substrate is flexible, localized flexing of the flexible package substrate is possible and should be considered so that the conductive traces, such as conductive traces 597 shown in FIG. 8, connecting the terminals to the leads, do not prematurely fatigue, crack or otherwise become unreliable. It is believed that the CTE of the compliant pads 510 should be in the range of 50 to 400 ppm/° C. and more preferably in the range of 50 to 100 ppm/° C. However, many compliant materials such as silicones which have other desirable properties for forming compliant pads have relatively high CTE, above the more preferred range of CTE. The composite layer in accordance with preferred aspects of this invention can accommodate such high CTE in the pads while still providing good performance in service. The CTE of the encapsulant 560 should be in range of 15 to 300 ppm/° C. and more preferably in the range of 20 to 80 ppm/° C. Typically, the modulus of the encapsulant is then in the range from 10 MPa to 8 GPa, and more preferably in the range of 100 MPa to 2 GPa thereby providing somewhat more rigid, lower expansion portions of the package around the compliant pads 510 and the leads 595. The differing properties of the compliant pad material and the encapsulant can also be portrayed by ratios of modulus and CTE. Desirably, the ratio between the elastic modulus of the encapsulant and the elastic modulus of the pad material is about 3:1 or more, and typically about 5:1 or more. The ratio between the CTE of the compliant pad material and the CTE of the encapsulant typically is about 2:1 and more typically about 5:1, although greater or lesser values can be used.

Somewhat similar to the embodiment described above and shown in FIG. 8, FIG. 9 shows a side view of a so called fan-in/fan-out variant of the present invention in which the inner terminals 680 are disposed within the periphery of the chip 600 and above the chip's contact 610 bearing surface. In this embodiment, the chip unit consists solely of the semiconductor chip 600. Chip 600 is juxtaposed with a flexible substrate 630 and attached thereto by a porous layer, such as the compliant pads 620, described above. As also described above, the function of the compliant pads 620 is to provide a uniformly supported, planar standoff between the chip and the flexible substrate thereby allowing the leads 650/660 to be bonded or otherwise attached to respective chip contacts 610 (as described above), and also allowing an encapsulant 690 to be injected between or dispensed and wicked between the adjacent pads 620 and between the chip 600 and the substrate 630 to create an encapsulation layer having a controlled thickness. As described above, so long as there is uniformity of support for the chip 600, it does not matter whether all of the pads 620 are of exactly the same height from the substrate to the chip surface.

Figure 9:
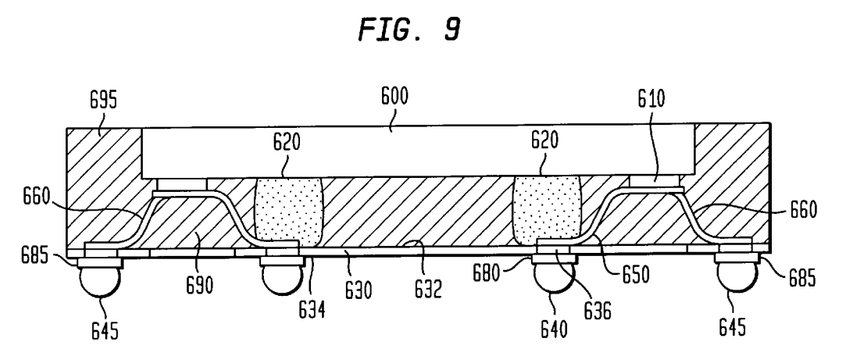
FIG. 9 shows a side view of a still further embodiment of the present invention having package a fan-in/fan-out package structure, according to a further embodiment of the present invention.

In the embodiment shown in FIG. 9, the substrate 630 is typically comprised of a high temperature dielectric film such as polyimide and has conductive features on at least one major surface 632/634 thereof. Said features including at least inner terminals 680 disposed above the periphery of the chip 600, outer terminals 685 disposed beyond the periphery of the chip 600 and traces (not shown) which connect terminals 680/685 to respective leads 650/660 or to other terminals. Examples of other conductive substrate features may include ground and power planes on at least portions of one or both surfaces 632/634 and thin or thick film resistors, capacitors and inductive elements.

In FIG. 9, leads connect to traces on an inner substrate surface 632 and connect to a respective terminal disposed on an outer substrate surface 634 through a conductive via 636 extending between the inner substrate surface 632 and the outer substrate surface 634. However, the terminals could also reside on the inner substrate surface 632 and an aperture could be created in the substrate 630 to expose such terminals for attachment of heat activated joining units 640/645, such as eutectic solder or solid core solder balls.

The compliant pads 620 are disposed on the inner substrate surface 632 facing the chip 600 and typically have a coefficient of thermal expansion ("CTE") in the range of those described immediately above with respect to FIG. 8. As stated above, each inner terminal 680 has a compliant pad 620 disposed in at least rough registration with it. In this embodiment, there are no compliant pads disposed in registration with the outer terminals 685. Examples of suitable compliant pad 690 materials include silicones, epoxies, urethanes, gels, foams and combinations, blends and composites of such materials.

As discussed immediately above, the filler encapsulant 690 is injected or dispensed between the chip 600 and the substrate 630 and subsequently cured by the application of a suitable catalyst, such as heat. In this embodiment, the encapsulant has a lower CTE than the compliant pads 620. Preferably, the encapsulant 690 has a CTE in the range of those described immediately above with respect to FIG. 8. Examples of suitable encapsulant materials include silicones, epoxies, urethanes, gels, foams and combinations, blends and composites of such materials. In one specific example of a chip assembly according to FIG. 9, the pad is formed from silicone loaded with fumed silica, having an elastic modulus of 80 MPa and CTE of 280 ppm/° C. The encapsulant is a Hysol epoxy having an elastic modulus of 500 MPa and CTE of 40 ppm/° C. Thus, the ratio of encapsulant elastic modulus to pad elastic modulus is about 6:1, whereas the ratio of pad CTE to encapsulant CTE is about 7:1.

The assembly shown in FIG. 9 is connected to other electronic elements by connecting the solder units 640/645 to respective contacts on a supporting substrate (not shown), such as a standard PWB. As described above with regard to the fan-out package structure shown in FIG. 8, at least a portion of the outer leads 660 shown in FIG. 9 are encapsulated in portion 695 of encapsulant 690 that has a greater thickness than the encapsulant 690 directly beneath the periphery of the chip 600. During thermal cycling of the chip 600, the chip 600 expands and contracts much less than the flexible substrate 630 or the PWB. The much higher CTE, low modulus compliant pads 620 help to accommodate for the strain placed on the solder units 640/645 between the flexible substrate and the PWB by the thermal mismatch between the chip 600 and the PWB by allowing the solder units and the attached terminals to move with respect to the contact bearing surface of the chip 600. At the same time, the encapsulant 690 a lower CTE than the CTE of the compliant pads 620 thereby providing more support for and less expansion in the area around the leads 650/660 so that the greater volume of encapsulant 690 in portions 695 does not cause the outer leads to flex to the point they pre-maturely fatigue and become unreliable. The lower CTE encapsulant also spreads the stress more uniformity across the leads.

Figure 10:
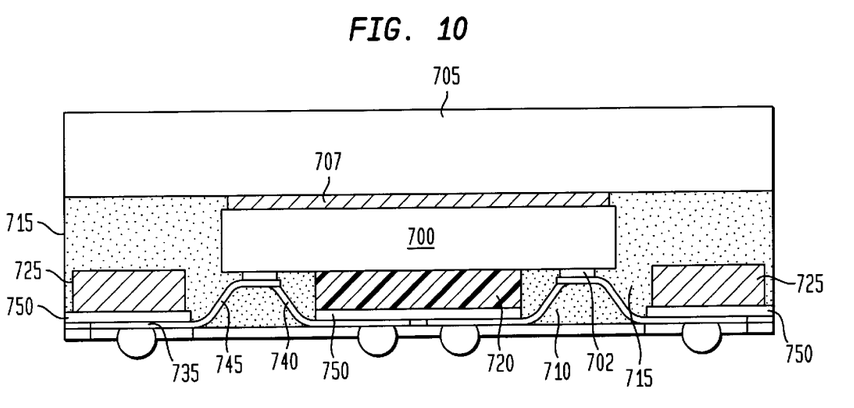
FIG. 10 shows a side view of a still further embodiment of the present invention having package a fan-in/fan-out package structure.

FIG. 10 is similar to the fan-in/fan-out chip package shown in FIG. 9, except that the package assembly has a planar heat spreader 705 attached to the back surface of the chip 700 (using a conventional die attach material 707) and the outer portions 715 of encapsulant 710 for better heat dissipation from the back surface of the chip 700. The other difference in the package constructions is that there are outer compliant pads 725 (as described above) in rough alignment with the outer terminals 735 to allow more independent movement of the individual outer terminals 735 during thermal cycling of the chip 700. As described above, the CTE of the compliant pads 720/725 is higher than the CTE of the encapsulant 710/715 to control the flexing of the leads 740/745 during thermal cycling of the chip 700. It is possible that the outer complaint pads 725 could extend from the substrate 750 to the planar heat spreader 705; however, it is believed in such an embodiment that the desired CTE of the outer pads 725 may need to be less than the CTE of the inner compliant pad 720 to control the displacement caused by the expansion and contraction of the larger volume of material comprising the outer pads 725. However, it is thought that this would depend somewhat on the modulus of the out pads.

The embodiments shown in FIGS. 9 and 10 may further be altered to create compliant pads having smaller height dimensions as measured upwardly in a perpendicular direction from the inner surface of the substrate 630/750. In such an arrangement, the compliant pads that are used to relieve stress on the solder balls during thermal cycling of the package would not also provide the function of a uniform die attach material for the chip. In this arrangement, other means of attaching the face surface of the chip in a roughly planar relationship with the inner surface of the package substrate, such as separate die attach posts or pads.

As described above, the compliant pads are attached to the substrate 750 prior to chip attach. The chip 700 is then juxtaposed with the substrate 700 and attached to the compliant pads 720. The leads 740/745 are then down set towards the chip 700 and bonded to respective chip contacts 702. The encapsulant 710 is then injected or deposited such that it wets the internal elements of the chip package and is then cured. If a planar heat spreader 705 is used (as shown), it would typically be attached to the back surface of the chip 700 prior to the encapsulation step. Also, an alternate heat spreader of the type shown in FIG. 8 could be used to allow the outer compliant pads 725 to be roughly the same thickness as the inner compliant pads 720. The lower CTE encapsulant could then be used to encapsulate the package, as discussed above.

It is believed that the above described arrangement of compliant pad to encapsulant CTE would also be useful in a simple fan-in embodiment as well, such as the embodiment shown in FIG. 2. It is further believed that this package arrangement would be useful even where a unitary pad is used instead of a plurality of compliant pads so long as the package terminals are aligned above the unitary pad and so long as the CTE of the compliant pad and the encapsulant were designed such that the traces on the substrate and the leads are not flexed to the point of fatigue by the unitary pad's larger volume and thus larger expansion and contraction characteristics when compared to the segmented pads. Even though the encapsulant 170 and compliant pad 110 layer would have a uniform thickness in such package structures, a lower CTE encapsulant in relation to the CTE of the compliant pad would allow a more controlled flexing of the leads 150 thereby improving the overall reliability of the leads.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A semiconductor chip package, comprising:
    a substrate having a first and a second surface, said substrate further having terminals, said terminals being exposed at the second substrate surface;
    one or more compliant pads having a first CTE juxtaposed with said first substrate surface;
    a chip unit including a semiconductor chip having a plurality of chip contacts on a face surface, said chip unit being attached to said one or more compliant pads;
    leads connecting said chip contacts to said terminals; and
    an encapsulant surrounding said one or more compliant pads so that said encapsulant and said one or more compliant pads form a composite layer between said chip unit and said substrate, said encapsulant having a second CTE that is lower than said first CTE.

2. The semiconductor chip package as claimed in claim 1 wherein said at least one pad includes a plurality of pads defining at least one channel therebetween and said encapsulant extends into said channel.

3. The semiconductor chip package as claimed in claim 1, wherein said terminals are located within a periphery of said chip.

4. The semiconductor chip package as claimed in claim 1, wherein said terminals are located beyond a periphery of said chip.

5. The semiconductor chip package as claimed in claim 1, wherein said terminals include inner terminals located within a periphery of said chip and outer terminals located beyond a periphery of said chip.

6. The semiconductor chip package as claimed in claim 1, wherein a plurality of said terminals are located above at least one compliant pad.

7. The semiconductor chip package as claimed in claim 1, wherein each said terminal is located above a respective compliant pad.

8. The semiconductor chip package as claimed in claim 1, wherein said substrate includes a potential plane on at least a portion of at least one said substrate surface.

9. The semiconductor chip package as claimed in claim 1, wherein said terminals are located on said first substrate surface.

10. The semiconductor chip package as claimed in claim 1, wherein said terminals are located on said second substrate surface.

11. The semiconductor chip package as claimed in claim 1, wherein said first CTE is between 50 to 400 ppm/° C. and said second CTE is between 15 to 300 ppm/° C.

12. The semiconductor chip package as claimed in claim 1 wherein the compliant pads have a modulus of elasticity of between 1 MPa. to 300 MPa. and said encapsulant has a modulus of elasticity of between 10 MPa. to 8 GPa.

13. The semiconductor chip package as claimed in claim 1, wherein the compliant pads are comprised of a material selected from the group consisting of silicones, epoxies, urethanes, gels, foams and combinations, blends and composites of such materials.

14. The semiconductor chip package as claimed in claim 1, wherein the encapsulant is comprised of a material selected from the group consisting of silicones, epoxies, urethanes, gels, foams and combinations, blends and composites of such materials.

15. The semiconductor chip package as claimed in claim 1, wherein the substrate is comprised of a flexible, dielectric layer.

16. The semiconductor chip as claimed in claim 3, wherein said substrate is flexible and said terminals are located above said compliant pads.

17. The semiconductor chip as claimed in claim 4, wherein said substrate is flexible and said terminals are located above said compliant pads.

18. The semiconductor chip package as claimed in claim 4, wherein said chip unit further comprises a heat spreader attached to a back surface of said chip and to said encapsulant.

19. The semiconductor chip package as claimed in claim 18, wherein the heat spreader is in the form of a substantially planar sheet.

20. The semiconductor chip package as claimed in claim 18, wherein the heat spreader has an indentation on a first surface such that flange regions encircle said indentation, said chip being positioned within said indentation.

21. The semiconductor chip package as claimed in claim 20, wherein the face surface of the chip is in rough co-planarity with said flange regions of said heat spreader.

22. The semiconductor chip package as claimed in claim 5, wherein said inner terminals are located above said compliant pads.

23. The semiconductor chip package as claimed in claim 5, wherein said inner terminals and said outer terminals are located above said compliant pads.

24. The semiconductor chip package as claimed in claim 5, wherein said chip unit further comprises a heat spreader attached to a back surface of said chip and to said encapsulant.

25. The semiconductor chip package as claimed in claim 24, wherein the heat spreader is in the form of a substantially planar sheet.

26. The semiconductor chip package as claimed in claim 24, wherein the heat spreader has an indentation on a first surface such that flange regions encircle said indentation, said chip being positioned within said indentation.

27. The semiconductor chip package as claimed in claim 26, wherein the face surface of the chip is in rough co-planarity with said flange regions of said heat spreader.

28. The semiconductor chip package as claimed in claim 27 wherein the composite layer includes a thin region having a first thickness including said pads and a thick region having a second thickness greater than said first thickness, said thick region including said encapsulant, at least some of said leads extending across said thick region, whereby expansion of said composite layer in said thick and flexure of the leads extending across the thick region due to such expansion is limited by the CTE of the encapsulant.

29. The semiconductor chip package as claimed in claim 11, wherein said first CTE is between 50 to 100 ppm/° C. and said second CTE is between 20 to 80 ppm/° C.

30. The semiconductor chip package as claimed in claim 12 wherein the compliant pads have a modulus of elasticity of between 50 MPa to 200 MPa and said encapsulant has a modulus of elasticity of between 100 MPa to 2 GPa.

31. A semiconductor chip package, comprising:
a flexible, sheet-like substrate having a first and a second surface, said substrate further having terminals, said terminals being exposed at the second substrate surface;
at least one compliant pad having a first modulus of elasticity abutting said first substrate surface, wherein said substrate terminals are located substantially above said at least one pad;
a chip unit including a semiconductor chip having a plurality of chip contacts on a face surface, said chip unit being attached to said one or more compliant pads;
leads connecting said chip contacts and said terminals; and
an encapsulant disposed surrounding said one or more compliant pads so that said encapsulant and said one or more compliant pads form a composite layer between said chip unit and said substrate, said encapsulant having a second modulus of elasticity that is higher than said first modulus of elasticity.

32. The semiconductor chip package as claimed in claim 31 wherein said at least one pad includes a plurality of pads defining at least one channel therebetween and said encapsulant extends into said channel.

33. The semiconductor chip package as claimed in claim 31, wherein said pads have a first CTE and said encapsulant has a second CTE lower than said first CTE.

34. The semiconductor chip package as claimed in claim 31, wherein said terminals are located within a periphery of said chip.

35. The semiconductor chip package as claimed in claim 31, wherein said terminals are located beyond a periphery of said chip.

36. The semiconductor chip package as claimed in claim 31, wherein said terminals include inner terminals located within a periphery of said chip and outer terminals located beyond a periphery of said chip.

37. The semiconductor chip package as claimed in claim 31, wherein a plurality of said terminals are located above at least one compliant pad.

38. The semiconductor chip package as claimed in claim 31, wherein each said terminal is located above a respective compliant pad.

39. The semiconductor chip package as claimed in claim 31, wherein said first CTE is between 50 to 400 ppm/° C. and said second CTE is between 15 to 300 ppm/° C.

40. The semiconductor chip package as claimed in claim 31, wherein said first CTE is between 50 to 100 ppm/° C. and said second CTE is between 20 to 80 ppm/° C.

41. The semiconductor chip package as claimed in claim 31, wherein said first modulus of elasticity is between 1 MPa. to 300 MPa. and said second modulus of elasticity is between 10 MPa. to 8 GPa.

42. The semiconductor chip package as claimed in claim 31, wherein the compliant pads are comprised of a material selected from the group consisting of silicones, epoxies, urethanes, gels, foams and combinations, blends and composites of such materials.

43. The semiconductor chip package as claimed in claim 31, wherein the encapsulant is comprised of a material selected from the group consisting of silicones, epoxies, urethanes, gels, foams and combinations, blends and composites of such materials.

44. The semiconductor chip package as claimed in claim 41, wherein said first modulus of elasticity is between 50 MPa to 200 MPa and said second modulus of elasticity is between 100 MPa to 2 GPa.

* * * * *

UNITED STATES PATENT AND TRADEMARK OFFICE
CERTIFICATE OF CORRECTION

PATENT NO. : 6,169,328
DATED : January 2, 2001
INVENTOR(S) : Mitchell et al.

It is certified that error appears in the above-identified patent and that said Letters Patent is hereby corrected as shown below:

Cover Page, (75), "Craig Mitchell" should be --Craig S. Mitchell--
Column 1, line 33, "interconnected" should read --interconnect--
Column 2, line 1, "Therefor"" should read --Therefor",--
Column 2, line 1, "Grabbe" should read --Grabbe,--
Column 2, line 10, "of a" should read --of an--
Column 3, line 28, delete "a"
Column 4, line 48, delete "package"
Column 4, line 52, delete "package"
Column 5, line 3, "of an" should read --of a--
Column 5, line 51, "80" should read --80,--
Column 5, line 51, "110" should read --110,--
Column 5, line 63, "corresponding the" should read --corresponding to the--
Column 6, line 7, "that the none" should read --that none--
Column 7, line 2, "Coming" should read --Corning--
Column 13, line 30, "so called" should read --so-called--
Column 14, line 50, "690 a" should read --690 has a--
Column 15, line 11, "out" should read --outer--

Signed and Sealed this

Eighth Day of May, 2001

Attest:

NICHOLAS P. GODICI

*Attesting Officer*      *Acting Director of the United States Patent and Trademark Office*